United States Patent
Huang et al.

(10) Patent No.: US 9,406,614 B2
(45) Date of Patent: Aug. 2, 2016

(54) MATERIAL AND PROCESS FOR COPPER BARRIER LAYER

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/790,945

(22) Filed: Mar. 8, 2013

(65) Prior Publication Data

US 2014/0252620 A1    Sep. 11, 2014

(51) Int. Cl.
| | |
|---|---|
| *H01L 23/532* | (2006.01) |
| *H01L 21/768* | (2006.01) |
| *H01L 21/321* | (2006.01) |
| *H01L 21/3213* | (2006.01) |

(52) U.S. Cl.
CPC ........ *H01L 23/53238* (2013.01); *H01L 21/321* (2013.01); *H01L 21/32136* (2013.01); *H01L 21/76834* (2013.01); *H01L 21/76841* (2013.01); *H01L 21/76885* (2013.01); *H01L 23/53233* (2013.01); *H01L 21/7682* (2013.01); *H01L 23/5329* (2013.01); *H01L 23/53223* (2013.01); *H01L 23/53266* (2013.01); *H01L 2924/0002* (2013.01)

(58) Field of Classification Search
CPC .................... H01L 21/76843; H01L 23/53238
USPC .......................................... 257/751, E23.151
See application file for complete search history.

(56) References Cited

U.S. PATENT DOCUMENTS

| | | | | |
|---|---|---|---|---|
| 6,297,169 | B1 * | 10/2001 | Mangat et al. | 438/736 |
| 6,509,209 | B1 * | 1/2003 | Shroff et al. | 438/131 |
| 6,784,093 | B1 * | 8/2004 | Lu et al. | 438/626 |
| 2005/0093162 | A1 | 5/2005 | Gracias | |
| 2009/0286394 | A1 | 11/2009 | Ko et al. | |
| 2010/0052080 | A1 | 3/2010 | Garcia Tello et al. | |

* cited by examiner

*Primary Examiner* — Amar Movva
(74) *Attorney, Agent, or Firm* — Slater Matsil, LLP

(57) ABSTRACT

A method of fabricating a semiconductor device comprises forming a first dielectric material layer on a semiconductor substrate. The first dielectric material layer is patterned to form a plurality of vias therein. A metal layer is formed on the first dielectric material layer, wherein the metal layer fills the plurality of vias. The metal layer is etched such that portions of the metal layer above the first dielectric material layer are patterned to form a plurality of metal features aligned with the plurality of vias respectively. A self-assembled monolayer film is formed on surfaces of the plurality of metal features.

22 Claims, 6 Drawing Sheets

MATERIAL AND PROCESS FOR COPPER BARRIER LAYER

BACKGROUND

In modern integrated circuits, minimum feature sizes, such as the channel length of field effect transistors, have reached the deep sub-micron range, thereby steadily increasing performance of these circuits in terms of speed and power consumption. As the size of the individual circuit elements is reduced, so is the available real estate for conductive interconnects in integrated circuits. Consequently, these interconnects have to be reduced to compensate for a reduced amount of available real estate and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements has now reached 0.18 μm and less, however, capacitance between neighboring conductive structures is increasingly problematic. Parasitic RC time constants therefore require the introduction of a new materials and methods for forming metallization layers.

Traditionally, metallization layers are formed by a dielectric layer stack, including, for example, silicon dioxide and/or silicon nitride with aluminum as the typical metal. Since aluminum exhibits significant electromigration at higher current densities, copper is replacing aluminum. Copper has significantly lower electrical resistance and reduced electromigration problems.

The introduction of copper, however, entails a plurality of issues to be dealt with. For example, copper may not be efficiently patterned by well-established anisotropic etch processes and therefore the so-called damascene technique is employed in forming metallization layers including copper lines. A further issue is the ability of copper to readily diffuse in silicon dioxide. Therefore, copper diffusion may negatively affect device performance, or may even lead to a complete failure of the device. It is therefore necessary to provide a diffusion barrier layer between the copper surfaces and the neighboring materials to substantially prevent copper from migrating to sensitive device regions. Silicon nitride (SiN), titanium nitride (TiN), and tantalum nitride (TaN) are known as effective copper diffusion barriers and are thus frequently used as dielectric barrier materials separating a copper surface from an interlayer dielectric, such as silicon dioxide. These barrier layer materials are typically deposited using current deposition techniques, such as physical vapor deposition (PVD) and atomic layer deposition (ALD). However, these deposition techniques for application of pattern material do not provide uniformity in pattern shape owing to a faster rate of deposition of the barrier layer material at an upper portion of the pattern as opposed to a lower portion of the pattern, thereby causing non-uniformity. Additionally, PVD and ALD require high temperatures and are costly.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
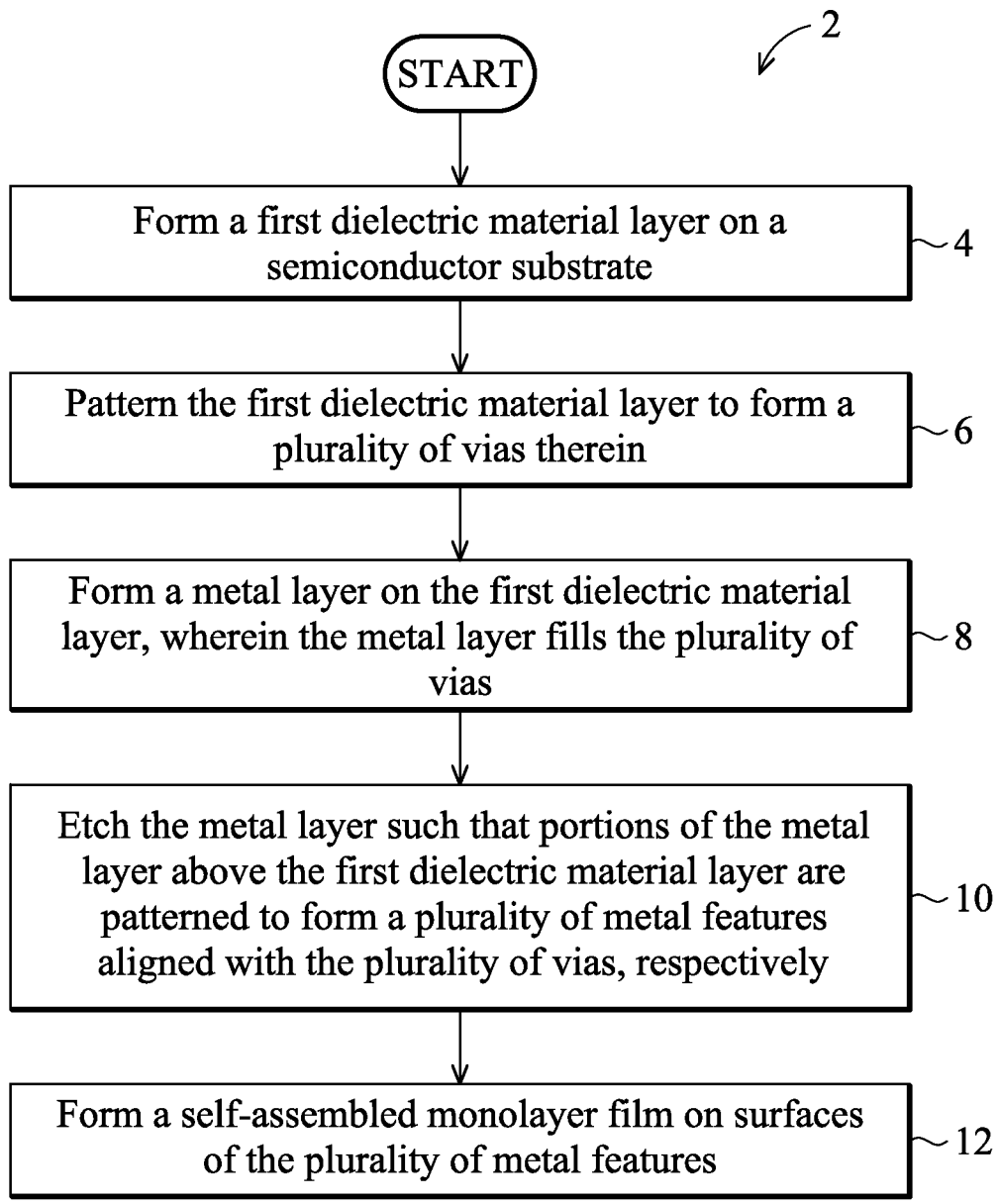
FIG. 1 is a flowchart of a method of fabricating a semiconductor device according to various embodiments of the present disclosure.

FIG. 1 is a flowchart of a method 2 for fabricating a semiconductor device according to various aspects of the present disclosure. Referring to FIG. 1, the method 2 includes block 4, in which a first dielectric material layer on a semiconductor substrate is formed. The method 2 includes block 6, in which the first dielectric material layer is patterned to form a plurality of vias therein. The method 2 includes block 8, in which a metal layer is formed on the first dielectric material layer, wherein the metal layer fills the plurality of vias. The method 2 includes block 10, in which the metal layer is etched such that portions of the metal layer above the first dielectric material layer are patterned to form a plurality of metal features aligned with the plurality of vias, respectively. The method 2 includes block 12, in which a self-assembled monolayer film is formed on surfaces of the plurality of metal features.

It is understood that additional processes may be performed before, during, or after the blocks 4-12 shown in FIG. 1 to complete the fabrication of the semiconductor device, but these additional processes are not discussed herein in detail for the sake of simplicity.

FIGS. 2-6 and 8-10 are diagrammatic fragmentary cross-sectional side views of a semiconductor device at various fabrication stages according to embodiments of the method 2 of FIG. 1. It is understood that FIGS. 2-6 and 8-10 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
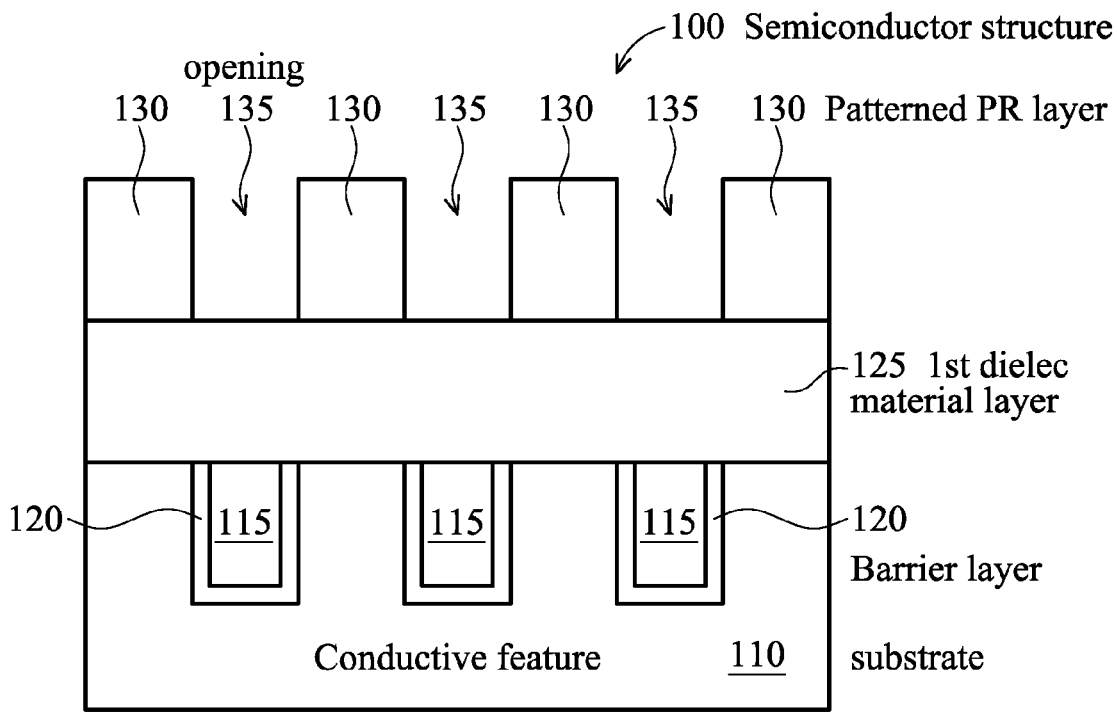
FIGS. 2-6 and 8-10 are diagrammatic fragmentary cross-sectional side views of a portion of a wafer at various stages of fabrication in accordance with various embodiments of the present disclosure.

Referring to FIG. 2, a semiconductor structure 100 is provided. The semiconductor structure 100 includes a semiconductor substrate 110 that includes silicon. Alternatively or additionally, the substrate 110 may include other elementary semiconductor such as germanium. The substrate 110 may also include a compound semiconductor such as silicon carbide, gallium arsenic, indium arsenide, and indium phosphide. In one embodiment, the substrate 110 includes an epitaxial layer. For example, the substrate may have an epitaxial layer overlying a bulk semiconductor. Furthermore, the substrate 110 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 110 also includes p-type doped regions and/or n-type doped regions, implemented by a process such as ion implantation and/or diffusion. Those doped regions include n-well, p-well, lightly-doped region (LDD), heavily-doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 110 may further include other functional features such as a resistor or a capacitor formed in and on the substrate. The substrate 110 further includes lateral isolation features provided to separate various devices formed in the substrate 110. In one embodiment, shallow trench isolation (STI) features are used for lateral isolation. The various IC devices may further include other features, such as silicide disposed on S/D and gate stacks overlying channels.

The semiconductor structure 100 may also include a plurality of dielectric layers and conductive features integrated to form an interconnect structure configured to couple the various p-type and n-type doped regions and the other functional features (such as gate electrodes), resulting in a functional integrated circuit. In one example, the semiconductor structure 100 may include a portion of the interconnect structure. The interconnect structure is further described later.

As noted above, the semiconductor structure 100 includes an interconnect structure. The interconnect structure includes a multi-layer interconnect (MLI) structure and an inter-level dielectric (ILD) integrated with the MLI structure, providing an electrical routing to couple various devices in the substrate 110 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 115 are shown in FIG. 2 for illustration. In one embodiment, the conductive features 115 include a portion of the interconnect structure. For example, the conductive feature 115 includes a contact, a metal via, or a metal line. In this case, the conductive features 115 may be further surrounded by a barrier layer 120 to prevent diffusion and/or provide material adhesion. The conductive feature 115 may include aluminum (Al), copper (Cu) or tungsten (W), or combinations thereof. The barrier layer 120 may include titanium nitride (TiN) tantalum nitride (TaN), tungsten nitride (WN), titanium silicon nitride (TiSiN) or tantalum silicon nitride (TaSiN), or the like. The conductive features 115 and the barrier layer 120 may be formed by a procedure including lithography, etching and deposition. In another embodiment, the conductive feature 115 includes an electrode of a capacitor, a resistor or a portion of a resistor. Alternatively, the conductive features 115 include a doped region (such as a source or drain), or a gate electrode. In another example, the conductive features 115 are silicide features disposed on a respective source, drain or gate electrode. The silicide feature may be formed by a self-aligned silicide (salicide) technique.

FIG. 2 also shows a first dielectric material layer 125 disposed on the substrate 110 and the conductive features 115. The first dielectric material layer 125 includes one dielectric material layer, such as silicon oxide, silicon nitride, a dielectric material layer having a dielectric constant (k) lower than thermal silicon oxide (thereafter referred to as low-k dielectric material layer), or other suitable dielectric material layer(s). In various examples, the low k dielectric material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyamide, and/or other materials as examples. In another example, the low k dielectric material may include an extreme low k dielectric material (XLK). In anther example, the low k dielectric material layer includes a porous version of an existing Dow Corning dielectric material called FOX (flowable oxide) which is based on hydrogen silsesquioxane. A process of forming the first dielectric material layer 125 may utilize spin-on coating or chemical vapor deposition (CVD). In one example, a chemical mechanical polishing (CMP) process, an etch back process, or the like, may be used to further planarize the top surface of the first dielectric material layer 125.

Also illustrated in FIG. 2, a patterned photoresist layer (or patterned resist layer) 130 is formed on the first dielectric material layer 125. The patterned resist layer 130 includes various openings 135 that define portions of the first dielectric material layer 125 for vias and expose those portions for subsequent etch. Particularly, the openings 135 are aligned with respective conductive features 115. In one embodiment, the patterned resist layer 130 is formed by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the resist layer 130 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more openings 135 as illustrated in FIG. 2. The lithography processes described above may only present a subset of processing steps associated with a lithography patterning technique. The lithography process may further include other steps such as cleaning and baking in a proper sequence. For example, the developed resist layer may be further baked, referred to as hard baking. In some embodiments, non-exposed portions are dissolved in the developer (i.e., both "positive resist" and "negative resist" photoresists are within the contemplated scope of the present disclosure).

Figure 3:
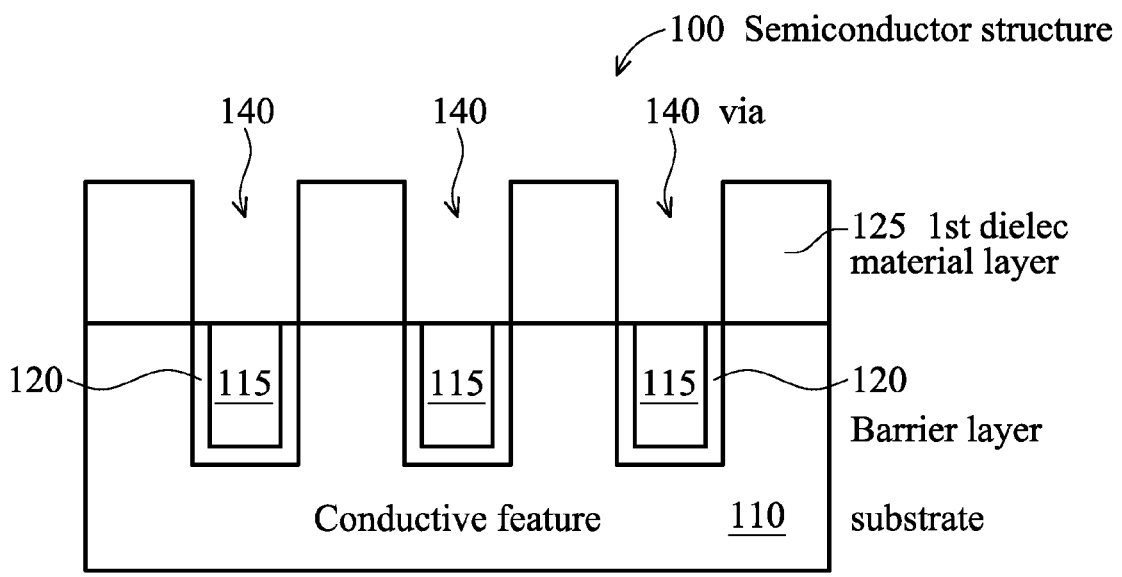

As illustrated in FIG. 3, the first dielectric material layer 125 is etched through the openings 135 of the patterned resist layer 130 using the patterned resist layer 130 as an etch mask, resulting in one or more vias 140 in the first dielectric material layer 125 such that the respective conductive features 115 are at least partially exposed within the vias 140. The first dielectric material layer 125 exposed within the openings 135 of the resist layer 130 is removed by an etch technique such as dry etch, wet etch, or combinations thereof. In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the vias 140, as illustrated in FIG. 3. Other dry-etch process may be alternatively used. The mechanism of etching in each dry-etch process may have a physical basis (e.g. glow-discharge sputtering, or ion milling) or a chemical basis (e.g., in pure plasma etching) or a combination of the two (e.g., reactive ion etching or RIE). Thereafter, the photo resist layer 130 may be removed by a process such as wet stripping or O2 plasma ashing. In another alternative embodiment, an etch stop layer is disposed between the substrate 110 and the first dielectric material layer 125 and the etch process includes a dry etch to etch through the first dielectric material layer and stops at the etch stop layer. The etch process may further include a wet etch to remove the etch stop layer within the vias 140. In another example, a hard mask may be utilized as an etch mask during the etch process to pattern the first dielectric material layer 125.

Figure 4:
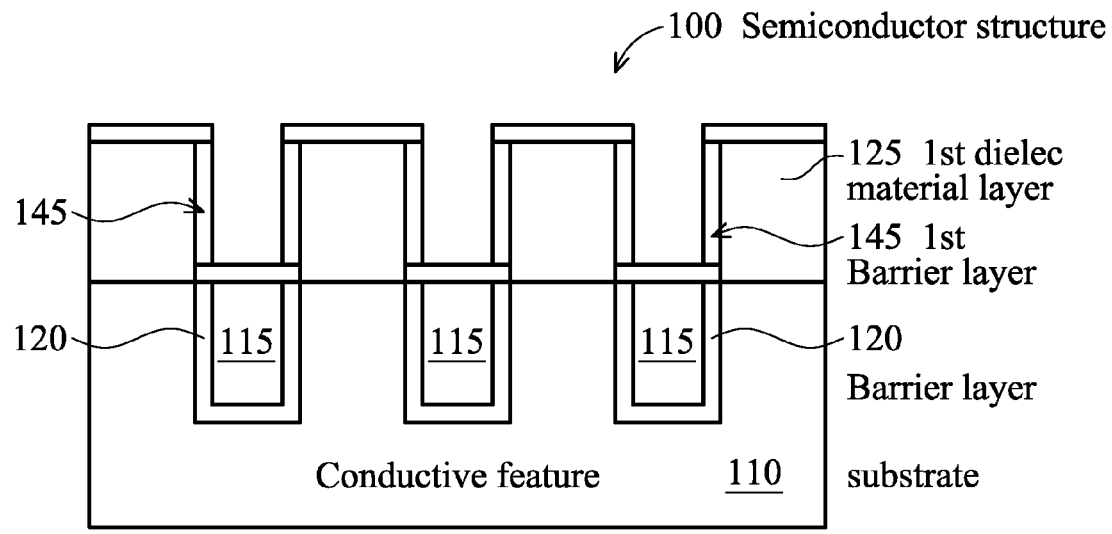
Figure 5:
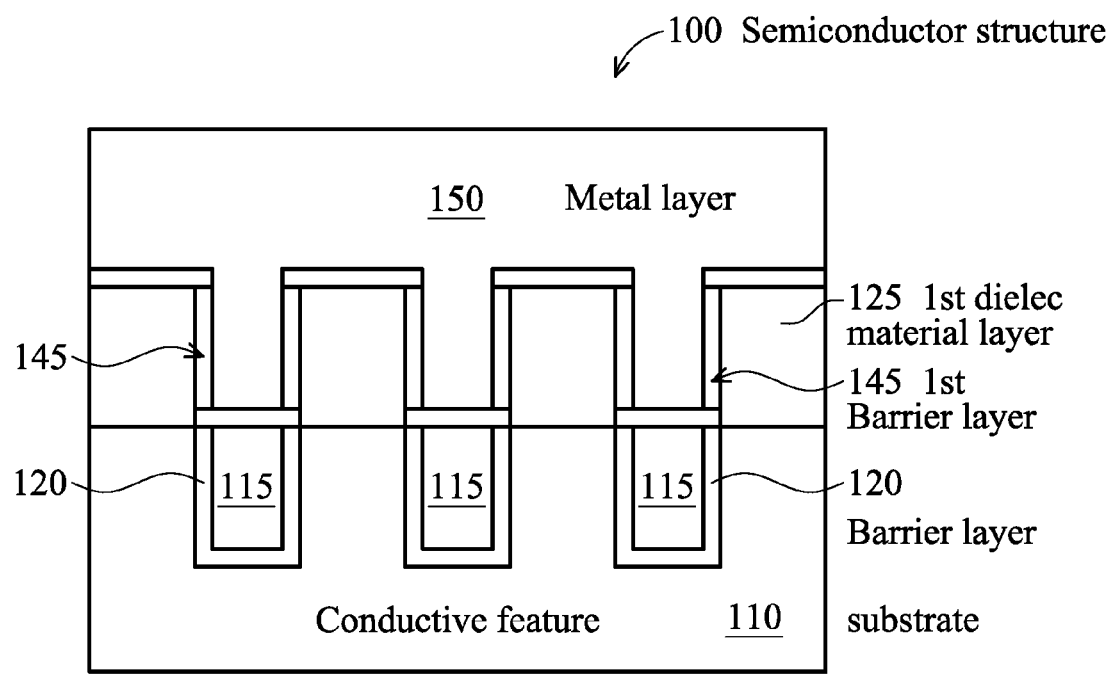

With reference now to FIG. 4, a first barrier layer 145 is formed in the vias 140, as well as on the top of the first dielectric material layer 125. In one embodiment, the first barrier layer 145 includes metal and is electrically conductive but does not permit inter-diffusion and reactions between the first dielectric material layer and a metal layer to be filled in the vias 140. The first barrier layer 145 may include refractory metals and their nitrides. In various examples, the first barrier layer 145 includes TiN, TaN, Co, WN, TiSiN, TaSiN, or combinations thereof. The first barrier layer 145 may include multiple films. For example, Ti and TiN films are used as the first barrier layer. The first barrier layer 145 may be deposited by physical vapor deposition (PVD), chemical vapor deposition (CVD), metal-organic chemical vapor deposition (MOCVD), atomic layer deposition (ALD), or other suitable techniques. In some embodiments as shown in FIG. 5, the first barrier layer 145 may be planarized by a chemical mechanical planarization (CMP) process, for example to leave behind the first barrier layer in the vias 140. Other methods for planarizing the first barrier layer 145 may also be used.

Referring to FIG. 5, a metal layer 150 is formed on the first barrier layer 145. The metal layer 150 fills in the vias 140 and is further disposed on and over the first dielectric material layer 125. The metal layer 150 may include copper (Cu), aluminum (Al), tungsten (W) or other suitable conductive material. In the present embodiment, the metal layer 150 includes copper or copper alloy, such as copper magnesium (CuMn), copper aluminum (CuAl) or copper silicon (CuSi). In furtherance of the present embodiment, the Mn concentration of the copper magnesium alloy ranges between about 0.5% and about 2% in weight. In one embodiment, the metal layer 150 includes a copper layer deposited by PVD. In another embodiment, the metal layer 150 includes a copper seed layer deposited by PVD and bulk copper layer by plating. In various other examples, copper deposition may be implemented by other techniques, such as PVD, CVD, MOCVD, or plating. A copper reflow process may be added to enhance the copper filling profile.

Figure 6:
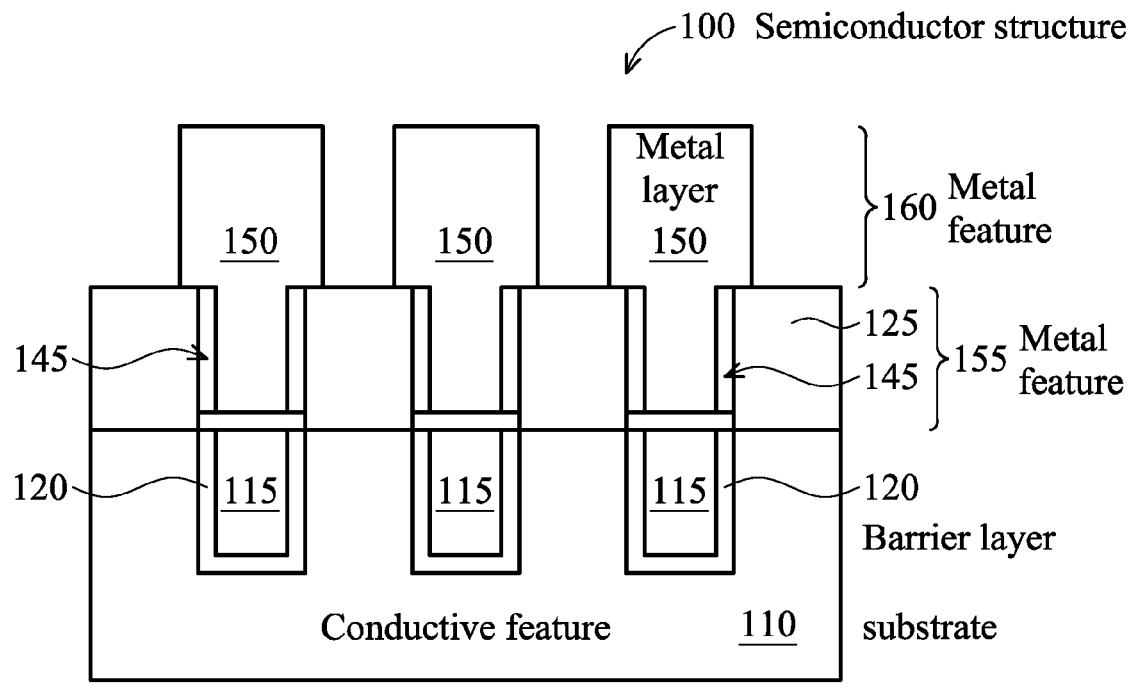

With reference now to FIG. 6, the metal layer 150 is patterned to form one or more metal features on the first dielectric material layer 125. The method for patterning the metal layer 150 includes a lithography process and etching. In the lithography process, a patterned resist layer (not shown) is formed on the metal layer 150 as an etch mask having various openings that exposes the regions of the metal layer to be removed. The lithography technique to form the patterned resist layer is similar to the technique for forming the patterned resist layer 130.

A metal etch process is applied to the metal layer 150 through the openings of the etch mask, resulting in various metal features 155 in the vias 140 and metal features 160 over the first dielectric material layer 125, as illustrated in FIG. 6. In one embodiment when the underlying conductive features 115 are metal lines of a different metal layer, the metal features 155 in the vias 140 are also referred to as metal vias, via features or vias to provide vertical electrical routing between metal lines. In an alternative embodiment when the underlying conductive features 115 are source/drain features and/or gate electrodes, the metal features 155 in the vias 140 are also referred to as metal contact, contact features or contacts to provide electrical routing between metal lines and the semiconductor substrate. In yet another embodiment, the metal features 160 over the first dielectric material layer 125 are referred to as metal lines to provide horizontal electrical routing.

The metal etch process is implemented using plasma etch. Usually copper is considered to be difficult to etch in plasma etching processes because it forms an etch product with chlorine-CuCl, which is relatively nonvolatile below a certain temperature degree. Thus copper may not be practically plasma etched with any one of the etchant gases containing chlorine. Therefore, copper etch may not be achieved by a traditional subtractive etching approach used to form aluminum metal lines. To overcome the nonvolatile copper compound and apply an appropriate gas combination has become a challenging task for copper plasma etch. In one embodiment, the etch gas includes carbon, hydrogen, oxygen, and nitrogen. In another embodiment, the copper etch gas applied in copper plasma etch includes a hydrogen containing gas, such as CxHy, CxFy, CxHyFz, or combinations thereof. The subscript x, y or z has a value greater than 0 and less than 6. The subscripts x, y and z may be omitted for simplicity in the following description. In this embodiment, the copper etch gas applied in copper plasma etch further includes at least one of CO and O2, and at least one of N2 and Ar. In a particular example, the gas flows for the hydrogen containing gas ranges between about 1 sccm and about 100 sccm; the gas flow of CO (or O2) ranges between about 1 sccm and about 500 sccm; and the gas flow of N2 (or Ar) ranges between about 1 sccm and about 1000 sccm. In furtherance of the present example, the plasma etch temperature (substrate temperature) is within a range of about 20 C and about 250 C. In another example, the plasma etch temperature is within a range of about 20 C and about 80 C. Our experiments indicate that the CuMn alloy has a higher etch rate. Some of our experiments further show that the etch rate is about 1.5 to 3 times of the etch rate of the copper metal layer without magnesium content.

Apart from the method described above for patterning the metal layer 150, other embodiments are also available. In one embodiment, a wet etch process may be alternatively or additionally used to pattern the metal layer 150. In yet another embodiment, when the metal layer 150 includes other suitable metal, such as aluminum or tungsten, other etch gas may be used. In yet another embodiment, a hard mask, such as silicon oxide, silicon carbide, silicon nitride, titanium nitride, or tantalum nitride may be formed as an etch mask by a procedure including lithography and etching.

Figure 7:
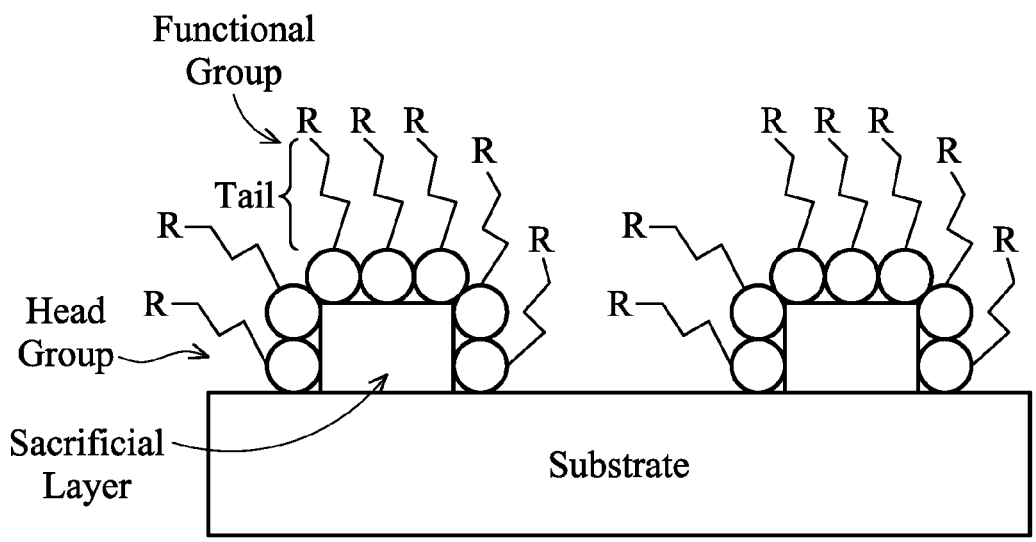
FIG. 7 is an illustration of an embodiment of a representation of a monolayer structure.

In an aspect of the present disclosure, in a process for the fabrication of a semiconductor device, a self-assembled monolayer (SAM) is formed over the semiconductor structure 100 and the metal features 160 and used as a copper barrier layer. In FIG. 7, there is illustrated a representation of a SAM which has been deposited on a sacrificial metal layer overlying a semiconductor substrate. The SAM comprises an organized layer of amphiphilic molecules in which one end of the molecule, the "head group" shows a specific, reversible affinity for a substrate. Generally, the head group is connected to an alkyl chain in which a tail or "terminal end" can be functionalized, for example, to vary wetting and interfacial properties. In one embodiment, the terminal end is functionalized to improve etch selectivity. Further, the carbon chain length (C—C)$^n$ of the alkyl chain will, in one embodiment, be adjustable to define critical dimension, for example, to increase or decrease a width of the pattern. Selection of the head group will depend on the application of the SAM, with the type of SAM compounds based on the substrate utilized. The head group may comprise, in one embodiment, an organosulfur compound, for example, din-alkyl sulfide, di-n-alkyl disulfides, thiophenols, mercaptopyridines, mercaptoanilines, thiophenes, cysteines, xanthates, thiocarbaminates, thiocarbamates, thioureas, mercaptoimidazoles, alkanethiols, and alkaneselenols. In one embodiment, the head group comprises a thiol, a chloride, or a fluoride. Substrates can include, for example, planar surfaces, such as silicon and metals, including copper, iron, silver, gold, nickel, platinum, palladium, and stainless steel; or curved surfaces, such as nanoparticles. In one embodiment, the substrate comprises a metal sacrificial layer.

Figure 8:
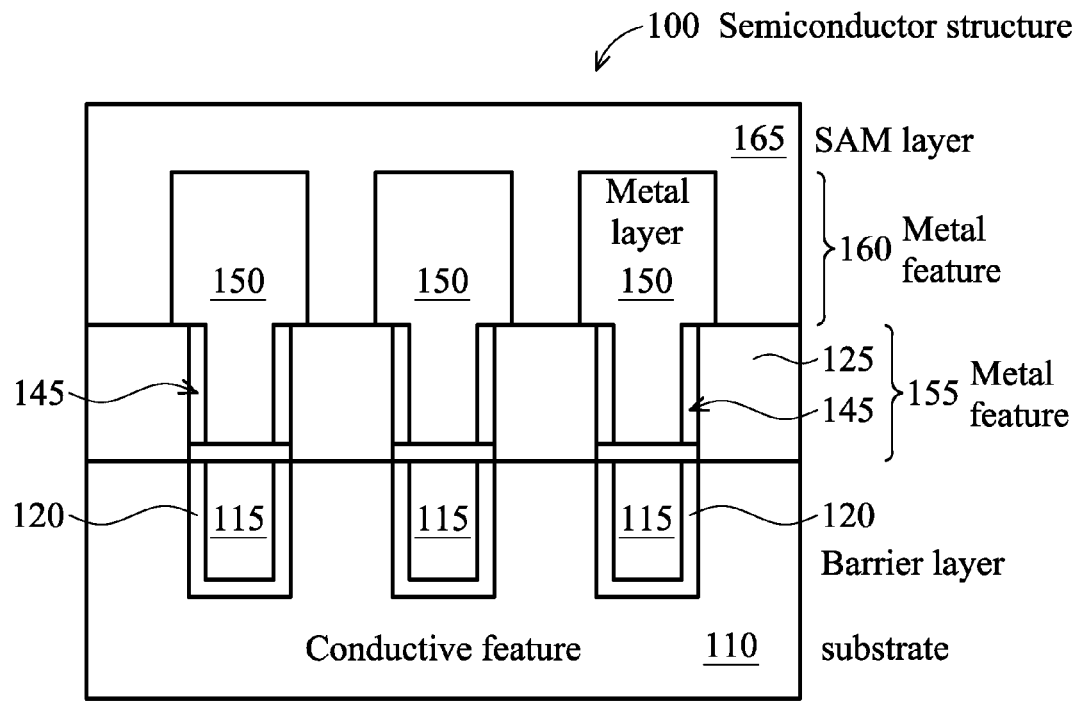
Figure 9:
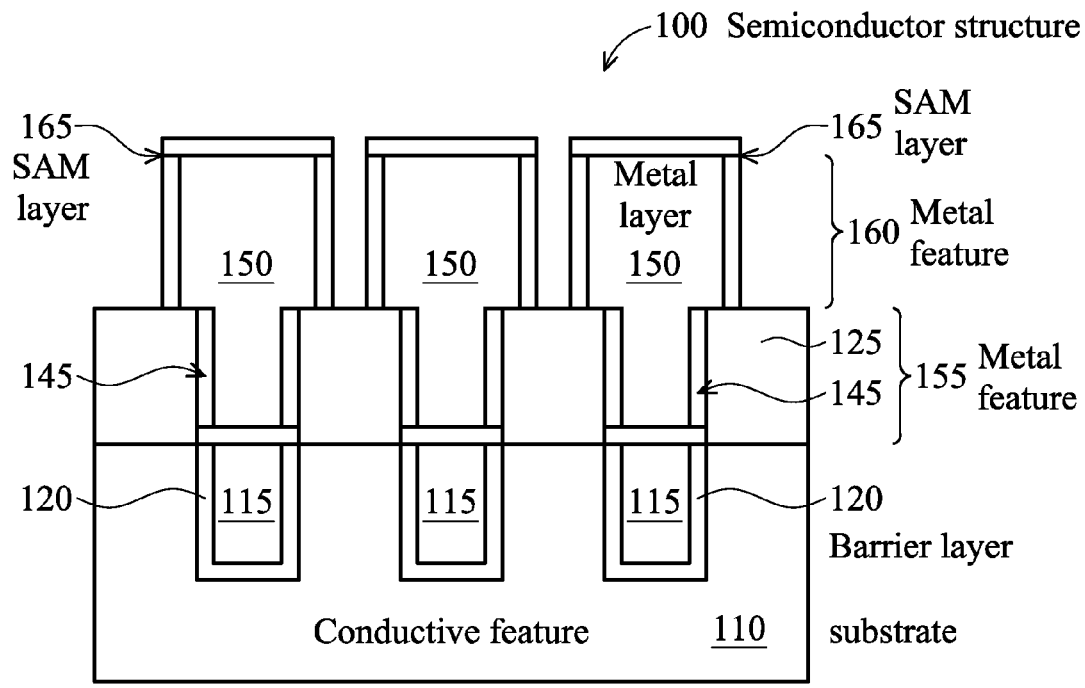

A self-assembled monolayer (SAM) 165 is deposited over the semiconductor structure 100 and on surfaces of the plurality of metal features 160 and the first dielectric material layer 125, as illustrated in FIG. 8. The SAM is created by chemisorption of the hydrophilic head groups onto the metal features 160, followed by a slow two-dimensional organization of hydrophobic tail groups. SAM adsorption can occur from solution by immersion of the substrate 110 into a dilute solution of, in one embodiment, an alkane thiol in ethanol. Adsorption may also occur from a vapor phase. The adsorbed molecules initially form a disordered mass of molecules, and instantaneously begin to form crystalline or semicrystalline structures on the metal features 160 in a first monolayer. Owing to the affinity of the head group of the SAM to the metal of the metal features 160, the SAM will selectively deposit on the metal features 160, forming a metal complex and the SAM will not react with the first dielectric material layer 125. The SAM may be deposited via spin-on coating from a solution of, for example, an alkane thiol in ethanol, among others. The un-reacted portions of the SAM formed on the surfaces of the first dielectric material layer 125 may be rinsed off using suitable solvent based rinse, leaving behind a layer of SAM on the surfaces of the metal features 160. It will be understood, however, that a thickness of the SAM layer left on the metal features 160 can be adjusted by adjusting the carbon chain length of the alkyl chain of the SAM, as shown in FIG. 9. Therefore, good uniformity of the SAM layer 165 can be achieved. In one embodiment, the SAM layer 165 has a thickness of less than about 10 Angstroms.

Figure 10:
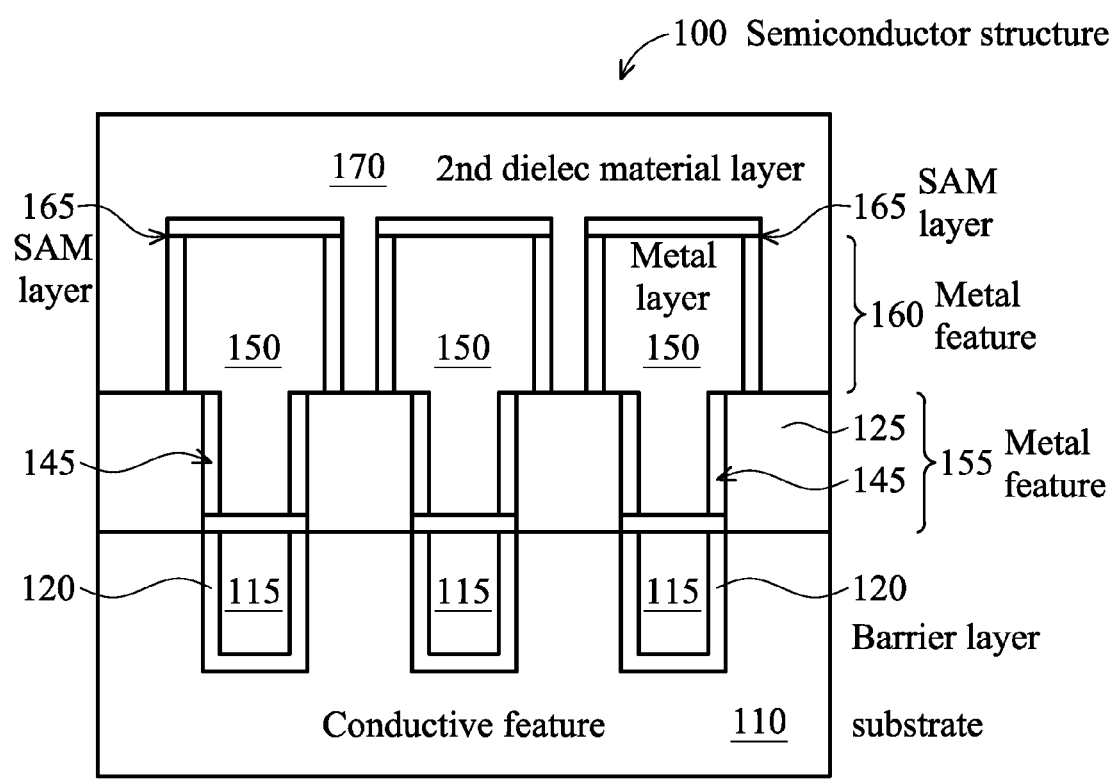

With reference now to FIG. 10, a second dielectric material layer 170 is formed around the metal features 160. In one embodiment, the second dielectric material layer 170 is similar to the first dielectric material layer 125 in terms of composition. For example, the second dielectric material layer 170 includes a low-k dielectric material, silicon oxide, or other suitable dielectric material layer. The second dielectric material layer 170 is disposed on the SAM layer 165 and on the first dielectric material layer 125. In one embodiment, the second dielectric material layer 170 substantially fills the regions between the metal features 160. Alternatively, the second dielectric material layer 170 disposed between the metal features 160 includes voids (or air gaps) to further reduce the average dielectric constant and increase the isolation efficiency. The air gaps may be formed by choosing and tuning a proper deposition process to form the second dielectric material layer 170.

In one embodiment, the second dielectric material layer 170 is deposited by CVD and the CVD deposition is tuned to form air gaps. For example, when the CVD deposition rate is tuned to be higher such that the second dielectric material layer 170 closes up before completely filling in the regions between the metal features 160, resulting in air gaps. In another embodiment, the second dielectric material layer 170 is deposited by a spin-on dielectric (SOD) process to substantially fill in the regions between the metal features 160. A chemical mechanical polishing (CMP) process may be applied to the second dielectric material layer 170 for planarization effect if a desired topography is needed.

The present disclosure has described various exemplary embodiments. According to one embodiment, a method of fabricating a semiconductor device comprises forming a first dielectric material layer on a semiconductor substrate. The first dielectric material layer is patterned to form a plurality of vias therein. A metal layer is formed on the first dielectric material layer, wherein the metal layer fills the plurality of vias. The metal layer is etched such that portions of the metal layer above the first dielectric material layer are patterned to form a plurality of metal features aligned with the plurality of vias respectively. A self-assembled monolayer film is formed on surfaces of the plurality of metal features.

According to another embodiment, a method of fabricating a semiconductor device comprises providing a semiconductor substrate. A first dielectric material layer is formed on the semiconductor substrate. The first dielectric material layer is patterned to form a plurality of vias therein. A metal layer is formed on the first dielectric material layer, wherein the metal layer fills the plurality of vias. The metal layer is etched such that portions of the metal layer above the first dielectric material layer are patterned to form a plurality of metal features aligned with the plurality of vias respectively. A self-assembled monolayer film is deposited over the semiconductor substrate and on surfaces of the plurality of metal features and the first dielectric material layer. The self-assembled monolayer film reacts with the metal in the plurality of metal features. Un-reacted portions of the self-assembled monolayer film formed on the surfaces of the first dielectric material layer are rinsed off, leaving behind self-assembled monolayer film on the surfaces of the metal features. A second dielectric material layer is formed on the self-assembled monolayer film and on the first dielectric material layer.

According to yet another embodiment, a semiconductor structure comprises a first low-k dielectric material layer disposed on a semiconductor substrate. First copper alloy alloy features are embedded in the first low-k dielectric material layer. A barrier layer surrounds the first copper alloy features and is interposed between the first low-k dielectric material layer and the first copper alloy features. A second low-k dielectric material layer is disposed on the first low-k dielectric material layer. Second copper alloy features are embedded in the second low-k dielectric material layer. A self-assembled monolayer film surrounds the second copper alloy features and is interposed between the second the second low-k dielectric material layer and the second copper alloy features.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of fabricating a semiconductor device, comprising:
    forming a first dielectric material layer on a semiconductor substrate;
    patterning the first dielectric material layer to form a plurality of vias therein;
    forming a metal layer on the first dielectric material layer, wherein the metal layer fills the plurality of vias;
    etching the metal layer such that portions of the metal layer above the first dielectric material layer are patterned to form a plurality of metal features aligned with the plurality of vias respectively; and
    forming a self-assembled monolayer film on surfaces of the plurality of metal features.

2. The method of claim 1, further comprising:
    forming a second dielectric material layer on surfaces of the self-assembled monolayer film and the first dielectric material layer.

3. The method of claim 1, further comprising:
    forming a barrier layer in the plurality of vias prior to the forming of the metal layer.

4. The method of claim 1, wherein the forming of the self-assembled monolayer film comprises spin-on coating.

5. The method of claim 1, wherein the self-assembled monolayer film comprises a head group and a tail group.

6. The method of claim 5, wherein the self-assembled monolayer film comprises a head group of a thiol, a chloride, or a fluoride.

7. The method of claim 5, wherein the plurality of metal features comprise a metal and a head group of the self-assembled monolayer film is specific to the metal.

8. The method of claim 5, wherein the tail group is functionalized to improve etch selectivity.

9. The method of claim 5, wherein the tail group is adjustable to increase or decrease a thickness of the self-assembled monolayer film.

10. The method of claim 9, wherein the self-assembled monolayer film is formed at a thickness of less than about 10 Angstroms.

11. The method of claim 1, wherein the self-assembled monolayer film, when formed, selectively forms on the plurality of metal features without forming on surfaces of the first dielectric material layer.

12. The method of claim 1, wherein the forming the metal layer includes forming a copper-containing material selected from a group consisting of copper (Cu), copper magnesium (CuMn), copper aluminum (CuAl), copper silicon (CuSi), and combinations thereof.

13. A method of fabricating a semiconductor device, comprising:
    providing a semiconductor substrate;
    forming a first dielectric material layer on the semiconductor substrate;
    patterning the first dielectric material layer to form a plurality of vias therein;
    forming a metal layer on the first dielectric material layer, wherein the metal layer fills the plurality of vias;
    etching the metal layer such that portions of the metal layer above the first dielectric material layer are patterned to form a plurality of metal features aligned with the plurality of vias respectively;
    depositing a self-assembled monolayer film over the semiconductor substrate and on surfaces of the plurality of metal features and the first dielectric material layer, the self-assembled monolayer film reacting with metal in the plurality of metal features;
    rinsing off un-reacted portions of the self-assembled monolayer film formed on the surfaces of the first dielectric material layer, leaving behind the self-assembled monolayer film on the surfaces of the plurality of metal features; and
    forming a second dielectric material layer on the self-assembled monolayer film and on the first dielectric material layer.

14. The method of claim 13, further comprising:
    forming a barrier layer in the plurality of vias prior to the forming of the metal layer.

15. The method of claim 13, wherein the self-assembled monolayer film is deposited by spin-on coating.

16. The method of claim 13, wherein the self-assembled monolayer film comprises a head group and a tail group, wherein the head group includes a thiol, a chloride, or a fluoride and the tail group is adjustable to increase or decrease a thickness of the self-assembled monolayer film.

17. The method of claim 16, wherein the tail group is functionalized to improve etch selectivity.

18. The method of claim 13, wherein the forming the metal layer includes forming a copper-containing material selected from a group consisting of copper (Cu), copper magnesium (CuMn), copper aluminum (CuAl), copper silicon (CuSi), and combinations thereof.

19. A method of fabricating a semiconductor device, comprising:
    disposing a first low-k dielectric material layer on a semiconductor substrate;
    embedding first copper alloy features in the first low-k dielectric material layer;
    forming second copper alloy features over the first low-k dielectric material layer and the first copper alloy features, wherein the second copper alloy features extend over a topmost surface of the first low-k dielectric material layer;
    surrounding the second copper alloy features with a self-assembled monolayer film, wherein the self-assembled monolayer film contacts the first low-k dielectric material layer; and
    forming a second low-k dielectric material layer over the first low-k dielectric material layer and the second copper alloy features.

20. The method of claim 19, wherein the step of surrounding the second copper alloy features with the self-assembled monolayer film includes:
    depositing the self-assembled monolayer film over the semiconductor substrate and on surfaces of the second copper alloy features and the first low-k dielectric material layer, the self-assembled monolayer film reacting with copper alloy in the second copper alloy features; and
    rinsing off un-reacted portions of the self-assembled monolayer film formed on the surfaces of the first low-k dielectric material layer, leaving behind the self-assembled monolayer film on the surfaces of the second copper alloy features.

21. A method comprising:
  forming a dielectric layer on a semiconductor substrate;
  forming a conductive feature over the semiconductor substrate, wherein a lower portion of the conductive feature is formed in the dielectric layer, and wherein an upper portion of the conductive feature is formed above the dielectric layer and in alignment with the lower portion; and
  forming a self-assembled monolayer film on a top surface of the upper portion of the conductive feature, the self-assembled monolayer film extending along a sidewall of the upper portion of the conductive feature.

22. The method of claim 21, wherein the forming the self-assembled monolayer film comprises spin-on coating.

\* \* \* \* \*